(12) United States Patent
Tada

(10) Patent No.: US 6,690,109 B2
(45) Date of Patent: Feb. 10, 2004

(54) ORGANIC ELECTROLUMINESCENCE ELEMENT AND MANUFACTURING METHOD THEREOF

(75) Inventor: Takumu Tada, Kanagawa-ken (JP)

(73) Assignee: Victor Company of Japan, Ltd. (JP)

( * ) Notice: Subject to any disclaimer, the term of this patent is extended or adjusted under 35 U.S.C. 154(b) by 0 days.

(21) Appl. No.: 10/214,259

(22) Filed: Aug. 8, 2002

(65) Prior Publication Data

US 2003/0030370 A1 Feb. 13, 2003

(30) Foreign Application Priority Data

Aug. 13, 2001 (JP) ........................................ 2001-245734
Apr. 24, 2002 (JP) ........................................ 2002-123144

(51) Int. Cl.$^7$ ............................................ H05B 33/00
(52) U.S. Cl. ........................ 313/504; 313/503; 313/506; 428/301.16; 428/301.36
(58) Field of Search ................................ 313/504, 503, 313/506, 502; 428/690, 301.16, 301.36

(56) References Cited

U.S. PATENT DOCUMENTS

| 5,895,692 A | | 4/1999 | Shirasaki et al. | |
| 6,410,166 B1 | * | 6/2002 | Takahashi et al. | 428/690 |
| 6,521,360 B2 | * | 2/2003 | Lee et al. | 428/690 |
| 6,541,129 B1 | * | 4/2003 | Kawamura et al. | 428/690 |

FOREIGN PATENT DOCUMENTS

JP        07-235378        9/1995

OTHER PUBLICATIONS

Florian Pschenitzka et al., "Three–Color Organic Light–Emitting Diodes Patterned by Masked Dye Diffusion", Applied Physics Letters, Mar. 29, 1999, vol. 74, No. 13, pp. 1913–1915.

Kazuya Tada et al., "Three–Color Polymer–Emitting Devices Patterned by Maskless Dye Diffusion Onto Prepatterned Electrode", Japanese Journal of Applied Physics, Oct. 1, 1999, vol. 38, Part 2, No. 10A, pp. L1143–L1145.

* cited by examiner

*Primary Examiner*—Edward J. Glick
*Assistant Examiner*—Elizabeth Gemmell
(74) *Attorney, Agent, or Firm*—Connolly Bove Lodge & Hutz LLP

(57) ABSTRACT

An organic electroluminescence element is composed of a plurality of first electrodes 18 that are disposed on a substrate 14 in matrix, a second electrode 26 that is disposed with being confronted with each of the plurality of first electrodes 18 and a emissive layer formed between each of the plurality of first electrodes and the second electrode on each of the plurality of first electrodes, wherein the emissive layer is composed of a blue (B) emissive layer, a green (G) emissive layer and a red (R) emissive layer as a set of pixels, the organic electroluminescence element is further characterized in that the B emissive layer contains a B emissive material, the G emissive layer contains B and G emissive materials, and the R emissive layer contains B and G and R emissive materials. Accordingly, the organic electroluminescence element is small in size and high in definition, performance and productivity.

1 Claim, 11 Drawing Sheets

ORGANIC ELECTROLUMINESCENCE ELEMENT AND MANUFACTURING METHOD THEREOF

BACKGROUND OF THE INVENTION

1. Field of the Invention

The present invention is related to an organic electroluminescence element, which is disposed with an arbitrary emitting color element at random after doping a predetermined emissive material (dye) at a predetermined position in an emissive layer of organic electroluminescence that is driven by a low voltage and luminous, and a manufacturing method thereof.

2. Description of the Related Arts

Generally, an organic electroluminescence element, which emits light by itself and has an ability of high-speed response and is independent of a viewing angle and anticipates lower power consumption, is considered as a display of the next generation. An area color system that combines monochromatic color partially is practically applied to a display panel for an audio system installed in an automobile and a display in which colors of red (R), green (G) and blue (B) are patterned by the masked vacuum evaporation method is practically applied to a cellular phone. Combining displaying elements corresponding to colors of red (R), green (G) and blue (B) enables to display full-color, so that various studies for obtaining an organic electroluminescence element in high performance that is driven by low voltage and emits light in high intensity are performed. A typical structure of organic electroluminescence element is that a thin film layer composed of an organic material is laminated on a transparent substrate such as glass, which is coated with a transparent electrode such as indium-tin oxide (ITO), and a metal electrode such as an alloy of MgAg (magnesium-silver) is laminated over the thin film layer. With respect to an organic material of the thin film layer or emissive layer that lies between the transparent electrode and the metal electrode, materials having fluorescence such as from polymer material to small molecular material, metal complex, and further heavy metal complex that has phosphorescence and emits light in extremely high efficiency are widely used. A method of laminating such an organic material is selected out of a wet method such as a coating method and a dry method such as the vacuum evaporation method in accordance with an organic material. An organic layer or the emissive layer in an organic electroluminescence element is divided into two types. One is a single layer type that is composed of only one layer and the other is a laminated layer type, which is multi-layered by a plurality of different materials in accordance with functions such as polarity of injecting electric charge, mobility of transporting electric charge and light-emitting ability. Light emitted from the organic layer is conducted through a transparent electrode or a transparent substrate.

FIG. 11 is a cross sectional view of an organic electroluminescence element of the prior art. In FIG. 11, an organic electroluminescence element is composed of a transparent substrate 2 that is made by glass or like and coated with a transparent electrode 4 of indium-tin oxide (ITO) or like thereon, a hole transport layer 6 of aryl diamine compound, a emissive layer 8 of organic metal complex of tris (8-quinolinol) aluminum (Alq3) as an electron transporter and a metal electrode 10 of the alloy of magnesium-silver (MgAg alloy). They are laminated in order. When a certain voltage is applied across the transparent electrode 4 and the metal electrode 10, a hole is injected from the transparent electrode 4 of ITO and an electron is injected from the metal electrode 10 of MgAg alloy. The hole and the electron recombine together at a neighborhood of boundary of organic layer between the hole transport layer 6 and the emissive layer 8, and emit light "L". The light "L" emitted from the emissive layer 8 is conducted to the outside of the organic electroluminescence element through the transparent electrode 4 and the transparent substrate 2. The emitted light is monochromatic light that depends on an emitting color of the emissive layer 8. In this case, the color of emitted light is green, which is caused by Alq3 mentioned above.

A so-called doping method is used for controlling chromaticity of a color of emitted light and increasing luminous intensity by mixing dye having a predetermined wavelength of emitted light in the emissive layer 8 and causing energy transfer from a host of the emissive layer to the dye. With respect to a material of the host of emissive layer, it is supposed to be necessary for the host material that emission spectrum of the host material has a wavelength within a same wavelength region as that of absorption spectrum of doped dye, or a shorter wavelength region than that of the absorption spectrum of the doped dye so as to overlap with the absorption spectrum of doped dye.

In order to display in full-color by conducting emitted light externally, it is essential to combine microscopic elements (sub-pixels) of each emitted light in colors of R, G and B into one pixel. Generally, a method such as the vacuum evaporation method and the coating method is used for manufacturing an organic electroluminescence element. However, it is hard to dispose elements in different colors of emitted light minutely. In a case of the vacuum evaporation method by using a small molecular material, for example, it is necessary for a deposition mask having a microscopic pixel shape to move, locate and face with each other accurately with keeping the mask so as to be apart from a pixel section and contact with a substrate closely. If a pixel area becomes more microscopic, increasing accuracy is required for mask producing technique and mechanism for locating and transferring, and it is resulted in decreasing productivity. Further, it is essential for a mask to be not only smaller in opening size but also thinner in thickness in accordance with a trend for higher definition. Therefore, handling of a mask such that bending or out of registration by heat causes positioning or replacing the mask becomes harder.

In a case of using a polymer material, a method of forming a microscopic pattern by coating each color emissive material on a pixel section through the ink-jet method is proposed. However, further improvement is required in accordance with a trend for higher definition such that an ink-jetting direction and an ink-jetting amount of droplet of each color emissive material is required for accuracy, ink-jetted droplet must be disposed in a predetermined position and a separator or bank of which surface is treated for decreasing surface energy is necessary for a substrate side to prevent the solution from breeding out from the predetermined position while drying.

Under these circumstances, following techniques are proposed for solving the above-mentioned problems so as to manufacture each of R (red), G (green) and B (blue) elements in high definition.

In order to emit white light, which covers a visible light range in a emissive layer as wide as possible, for example, a emissive layer in which plural kinds of fluorescent dye are diffused is formed. The emissive layer is referred to as a white emissive layer. The white emissive layer is combined with a color filter so as to produce any emitting color of R, G and B. Consequently, sub-pixels can be microscopically disposed by being combined with a color filter that is produced by the photolithography technique without disposing a emissive layer minutely.

Further, in a case of emitting white light, there has been provided a plurality of methods through the vacuum evaporation method such that laminating each of R, G and B layers and combining a B layer with a yellow emissive layer, which is in relation to complimentary color of B-color light, produces white light. However, a white-light emitting element having high efficiency and long life is hard to be realized in comparison with a monochromatic-light emitting element.

Furthermore, there existed another problem that utilization efficiency of emitted light decreases because a white-light emitting element is designated to be each color light-emitting element through a color filter.

More, a method of forming a blue emissive layer and a color converting layer, which converts blue light emitted from the blue emissive layer into green and red by the down-conversion of wavelength, has been proposed. However, there still existed room for further improvement such as efficiency of converting blue into red and converted chromaticity, in particular.

Moreover, in a case of patterning of polymer emissive material, the Japanese Patent Application Laid-open Publication No. 7-235378/1995 and the U.S. Pat. No. 5,895,692 (Apr. 20, 1999) disclose a method of dispersing dye into a polymer emissive layer by the infrared heating method, wherein a layer containing R, G and B fluorescent dye is formed on the surface of the polymer emissive layer by the ink-jet method or the screen printing method after the polymer emissive layer has been produced by the wet method such as the spin coating and dip coating methods. With respect to the screen printing method, forming a bank in an area other than an opening section is essential so as to dispose ejected ink accurately, and resulted in difficulty of manufacturing in accordance with advancing higher definition.

In addition thereto, with respect to a method of patterning fluorescent dye by heating, a method of sublimating and dispersing dye confronting with a emissive layer through a shadow mask from a layer of dye in high density to the emissive layer is disclosed in the publication: "Applied Physics Letters", vol. 74, No. 13, pp. 1913–1915 (1999). Another method of heating an ITO (indium tin oxide) lower electrode composed of a high density dye layer and a emissive layer confronting with each other is disclosed in the publication: "Japanese Journal of Applied Physics", vol. 38 Part 2, No. 10A, pp. L1143–L1145 (1999).

As mentioned above, the masking method is resulted in difficulty of producing pattern in high definition when making the pattern more microscopic as the same situation as the vacuum evaporation method. In the case of the method of heating by electrode, temperature difference between the electrode and its surrounding area is essential, so that the method is unsuitable for an element in high definition.

SUMMARY OF THE INVENTION

Accordingly, in consideration of the above-mentioned problems of the prior art, an object of the present invention is to provide an organic color electroluminescence element, which is small in size, high in definition, high in performance and excellent in productivity, and to provide a manufacturing method of the organic color electroluminescence element by making use of characteristics of organic thin film electroluminescence.

In order to achieve the above object, the present invention provides, according to an aspect thereof, an organic electroluminescence element comprising: a plurality of first electrodes disposed on a substrate in matrix; a second electrode disposed with being confronted with each of the plurality of first electrodes; and a emissive layer formed between each of the plurality of first electrodes and the second electrode on each of the plurality of first electrodes, wherein the emissive layer is composed of a blue (B) emissive layer, a green (G) emissive layer and a red (R) emissive layer as a set of pixels, the organic electroluminescence element is further characterized in that the B emissive layer contains a B emissive material, the G emissive layer contains B and G emissive materials, and the R emissive layer contains B, G and R emissive materials.

According to another aspect of the present invention, there provided a manufacturing method of an organic electroluminescence element comprising steps of: forming a first electrode divided by a plurality of separators and disposed on a substrate in matrix; forming a blue (B) emissive layer on the first electrode by diffusing a B emissive material; obtaining a green (G) emissive layer adjacent to the B emissive layer after diffusing a G emissive material in a part of the B emissive layer; obtaining a red (R) emissive layer adjacent to the G emissive layer after diffusing a R emissive material in a part of the G emissive layer; and forming a second electrode on each of the R and G and B emissive layers.

According to further aspect of the present invention, there provided a manufacturing method of an organic electroluminescence element comprising at least a first electrode, a emissive layer and a second electrode on a substrate, the manufacturing method comprising steps of: forming a plurality of first electrodes on the substrate; forming at least either one of an electric charge injecting layer and an electric charge transporting layer on the plurality of first electrodes; forming a emissive layer on the plurality of first electrodes; forming at least either one of the electric charge injecting layer and the electric charge transporting layer on the emissive layer; and forming a second electrode on at least either one of the electric charge injecting layer and the electric charge transporting layer, the manufacturing method is further characterized in that emissive layers for a blue (B) color, a green (G) color and a red (R) color are formed in order during the step of forming a emissive layer.

Other object and further features of the present invention will be apparent from the following detailed description when read in conjunction with the accompanying drawings.

DETAILED DESCRIPTION OF THE PREFERRED EMBODIMENTS

In this embodiment, it is explained as an example that a semiconductor substrate is used for a substrate. However, it should be understood that the substrate is not limited to a semiconductor substrate, any substrate such as a LCD (liquid crystal display) substrate and a glass substrate can be applied for the substrate of the present invention.

Figure 1:
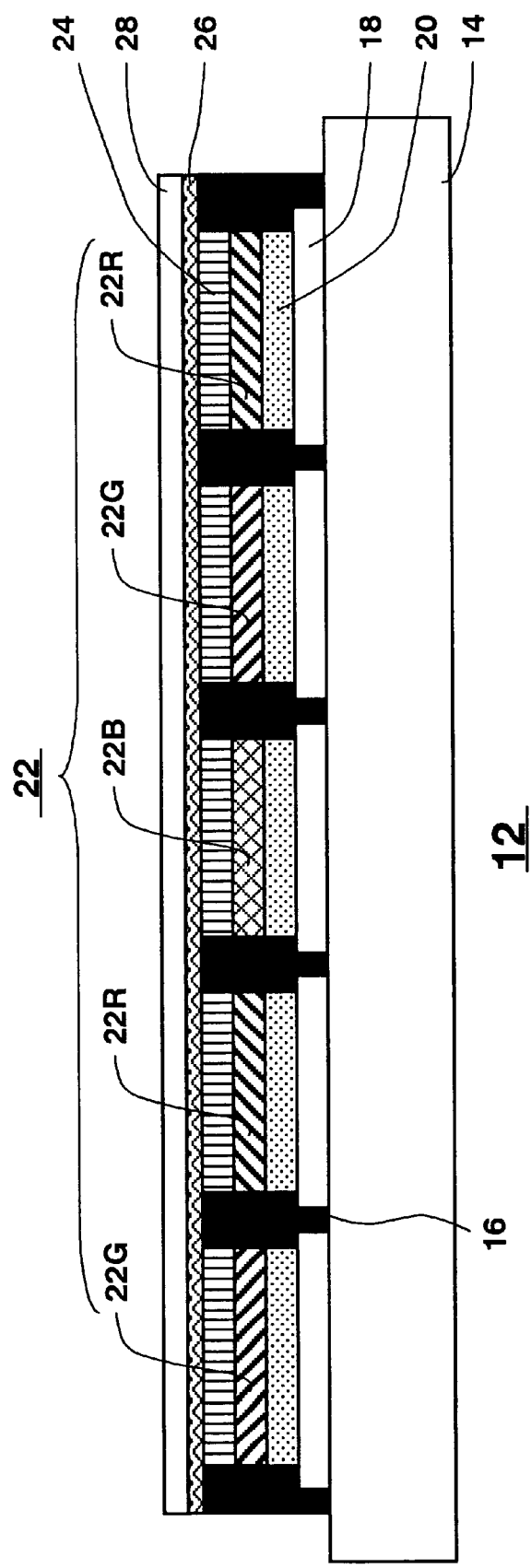
FIG. 1 is an enlarged cross sectional view of an organic electroluminescence element according to an embodiment of the present invention.

FIG. 1 is an enlarged cross sectional view of an organic electroluminescence element according to an embodiment of the present invention. In FIG. 1, an organic electroluminescence element 12 is composed of a semiconductor substrate 14 that is made by a silicon substrate, for example, as a foundation and formed with an active matrix thereon.

Further, a plurality of first electrodes 18 that becomes a pixel electrode and is formed by being divided into a plurality of sections is formed on the surface of the semiconductor substrate 14, wherein each of the plurality of sections is separated by a plurality of separators 16.

Furthermore, on each of the plurality of first electrodes 18, a hole transport layer 20 as an electric charge transport layer, an emissive layer 22, an electron transport layer 24 as an electric charge transport layer, a second electrode 26 that is a thin film cathode and a transparent electrode 28 are laminated in order. By substituting the hole transport layer 20 or in conjunction with the hole transport layer 20, a hole injection layer can be provided as an electric charge injection layer.

More, by substituting or in conjunction with the electron transport layer 24, an electron injection layer can be provided as an electric charge injection layer.

Moreover, the second electrode 26 is provided in common all over the organic electroluminescence element 12.

In addition thereto, a protective layer (not shown) is provided over the transparent electrode 28 actually.

A small area that is divided by the separator 16 constitutes a sub-pixel, and resulted in constituting one pixel that is constituted by three color sub-pixels of R (red), G (green) and B (blue). In the case of FIG. 1, five sub-pixels are exhibited. In FIG. 1, an emissive layer of a center sub-pixel is a blue (B) emissive layer 22B, a emissive layer of a sub-pixel that is disposed on the right side of the center sub-pixel is a green (G) emissive layer 22G and a emissive layer of a sub-pixel that is disposed on the far-right side of the center sub-pixel is a red (R) emissive layer 22R.

Further, a emissive layer of a sub-pixel that is disposed on the left side of the center sub-pixel is the R emissive layer 22R and a emissive layer of a sub-pixel that is disposed on the far-left side of the center sub-pixel is the G emissive layer 22G. As mentioned above, the emissive layer 22 is composed of the B emissive layer 22B, the G emissive layer 22G and the R emissive layer 22R. The B emissive layer 22B contains a B emissive material, the G emissive layer 22G contains B and G emissive material, and the R emissive layer 22R contains B and G and R emissive materials.

A manufacturing method of the organic electroluminescence element 12 is explained next.

According to the present invention, an organic electroluminescence element having sub-pixels that emit respective light of R, G and B is realized, wherein the sub-pixels are produced by transferring and diffusing (hereinafter referred to as doping) emissive materials (hereinafter referred to as dye) for R, G and B light. In order to dope each dye of R, G and B into the emissive layer 22, a dye stamp having a series of predetermined dye patterns of R, G and B is previously produced in an independent process. The dye stamp is disposed so as to confront with the surface of the emissive layer 22 that is divided by the separator 16, and then heated so as to diffuse the dye into the emissive layer 22.

Currently, pixel density that is presented as technical announcement is approximately the order of 100 ppi (pixel per inch) to 150 ppi and length of a minor axis of sub-pixel is approximately the order of 50 $\mu$m to 110 $\mu$m. It is supposed that an organic electroluminescence element is advanced to higher definition as the same situation as an LCD, so that patterning by less than 30 $\mu$m is required, particularly, patterning by less than 10 $\mu$m is essential for a micro display device. In a case of producing a pixel in high definition, for example, with defining that a diagonal size of screen is one inch, one pixel pitch is equal to 10 $\mu$m (×3: RGB)×30 $\mu$m for the VGA level of 640×480 pixels. In this case, gap between adjacent pixels becomes less than 1 $\mu$m. Therefore, it is essential for an edge portion of each pixel to be held accurately so as to be transferred accurately.

With respect to a producing method of the dye stamp, any of following methods shown by FIGS. 2(a) to 5(g) can be used.

Figure 2A:
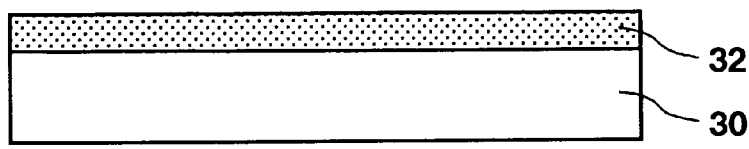
FIGS. 2(a) to 2(c) show a series of first producing process of a first convex dye stamp used for manufacturing the organic electroluminescence element according to the present invention.
Figure 2B:
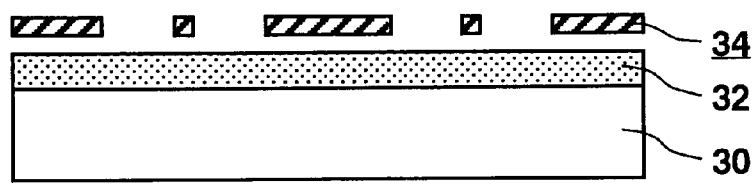
Figure 2C:
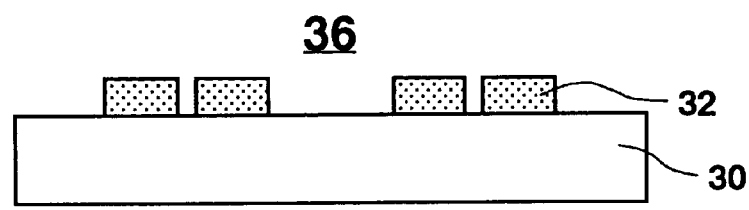

FIGS. 2(a) to 2(c) show a first producing method of a first convex dye stamp having a series of protruding patterns by forming a photo-sensitive resin pattern containing dye on a stamp substrate that is constituted by a silicon substrate, for example.

FIGS. 3(a) to 3(f) show a second producing method of a second convex dye stamp having a series of protruding patterns by diffusing dye into a photo-sensitive resin layer that is patterned.

FIGS. 4(a) to 4(f) show a third producing method of a third convex dye stamp having a series of protruding patterns by forming dye on a series of protruding patterns over a stamp substrate such as a silicon substrate having a series of protruding patterns that corresponds to a pixel pattern through a convex shaped stamp that is formed by patterning a dye film by the laser ablation method.

FIGS. 5(a) to 5(g) show a fourth producing method of a concave dye stamp having a series of recessed patterns by forming dye and a release film in a recessed pattern on a stamp substrate such as a silicon substrate having a series of recessed patterns that corresponds to a pixel pattern.

Theses stamp substrates are essential to have excellent surface flatness and to be able to process minutely so as to be contacted with an electroluminescence element. A material such as glass, $SiO_2$ (quartz), sapphire and alumina can be used for a stamp substrate. However, a silicon substrate that is excellent in surface flatness and easy to process minutely is most desirable for a stamp substrate.

In the first producing method exhibited in FIGS. 2(a) to 2(c), as shown in FIG. 2(a), a thin film 32 is formed on a stamp substrate 30 by depositing solution of photo-sensitive resin that is dissolved with first dye through the wet processing method such as the spin coating method. In FIG. 2(b), the thin film 32 is exposed by ultraviolet (UV) irradiation through a photo mask 34 having an opening that corresponds to a predetermined shape, wherein a portion having the predetermined shape on the photo mask 34 is cut off from the photo mask 34 if the photo-sensitive resin is a positive type photo-sensitive resin.

Further, as shown in FIG. 2(c), the photo mask 34 is removed and the thin film 32 that is exposed by the UV irradiation is developed by solvent that dissolves the exposed photo-sensitive resin, and then a photo-sensitive resin layer 32 containing the first dye is formed in a block shape.

The same process shown in FIGS. 2(a) to 2(c) is repeated for producing a dye stamp having a predetermined R-G-B pattern by using solution of photo-sensitive resin that is dissolved with second and third dye while the photo mask 34 is replaced by one for a predetermined color. Consequently, a first convex dye stamp 36 shown in FIG. 2(c) can be produced.

In addition, when a blue emissive layer is formed on a substrate for organic electroluminescence element previously, dye stamps to be produced are for two colors of green and red.

Figure 3A:
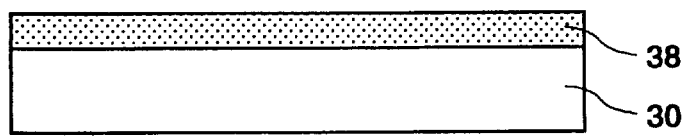
FIGS. 3(a) to 3(f) show a series of second producing process of a second convex dye stamp used for manufacturing the organic electroluminescence element according to the present invention.
Figure 3B:
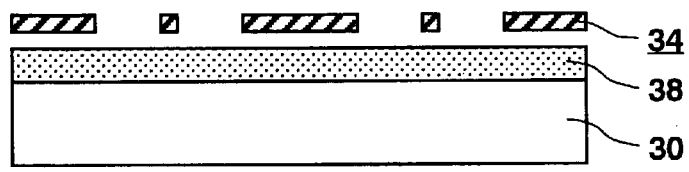
Figure 3C:
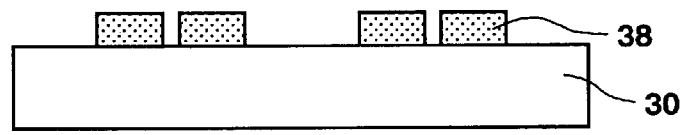
Figure 3D:
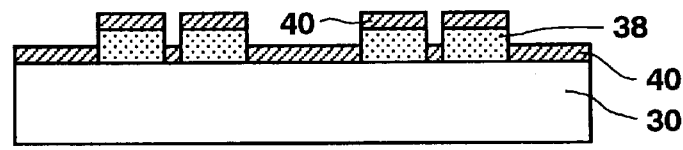
Figure 3E:
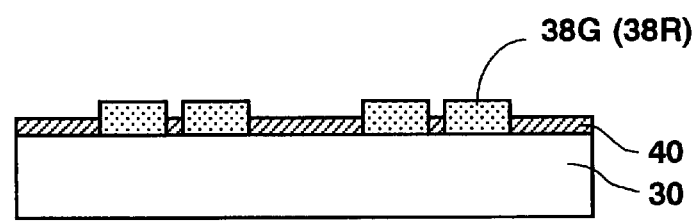
Figure 3F:
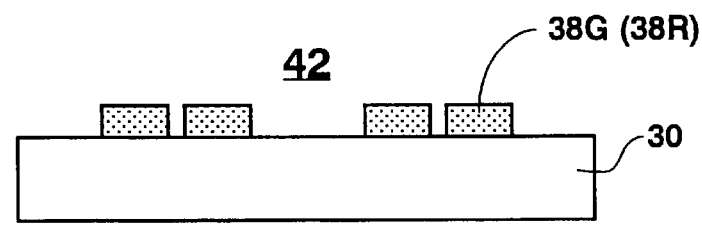

According to the second producing method exhibited in FIGS. 3(a) to 3(f), as shown in FIG. 3(a), photo resist 38 is coated on a stamp substrate 30. In FIG. 3(b), the photo resist 38 is exposed by UV irradiation through a photo mask 34 that is patterned. In FIG. 3(c), the photo mask 34 is removed and the photo resist 38 that is exposed by the UV irradiation is developed and formed with the pattern of the photo resist 34. In FIG. 3(d), a dye layer 40 is deposited all over the photo resist 38 and the stamp substrate 30 by the vacuum evaporation method or like. In FIG. 3(e), dye that is contained in the dye layer 40 is diffused into resin of the photo resist 40 by heating, and resulted in producing a photo resist having dye such as a G photo resist 38G and an R photo resist 38R. In FIG. 3(f), solvent that does not solve the resin of the photo resist 38 rinses unnecessary dye layer 40 out. Consequently, a second convex dye stamp 42 shown in FIG. 3(f) can be produced. In addition, the second convex dye stamp 42 for each color is produced respectively.

Figure 4A:
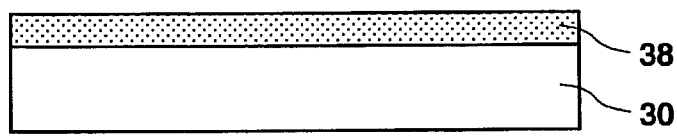
FIGS. 4(a) to 4(f) show a series of third producing process of a third convex dye stamp used for manufacturing the organic electroluminescence element according to the present invention.
Figure 4B:
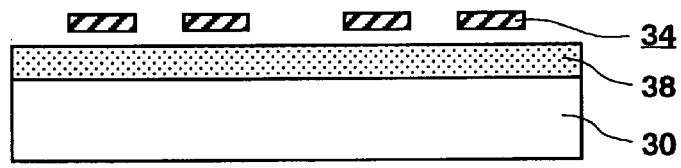
Figure 4C:
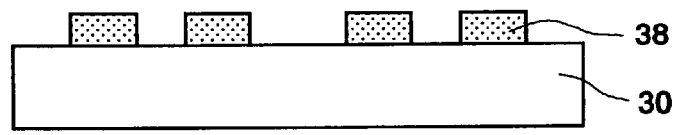
Figure 4D:
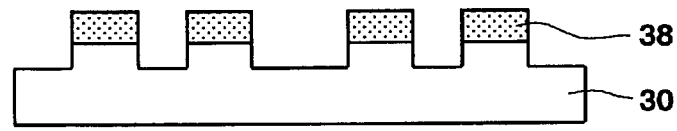
Figure 4E:
Figure 4F:
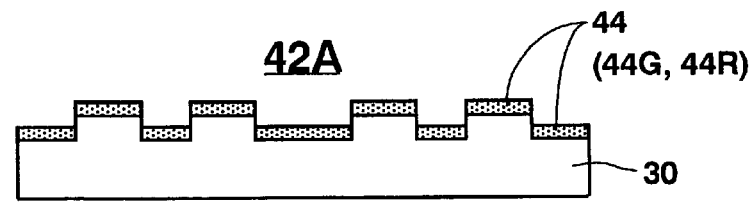
Figure 5A:
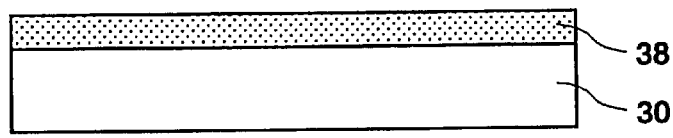
FIGS. 5(a) to 5(g) show a series of fourth producing process of a concave dye stamp used for manufacturing the organic electroluminescence element according to the present invention.
Figure 5B:
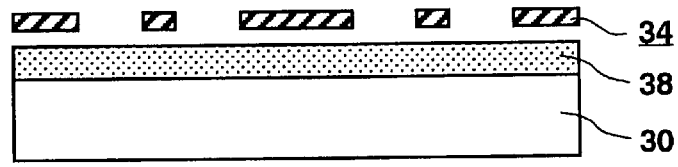
Figure 5C:
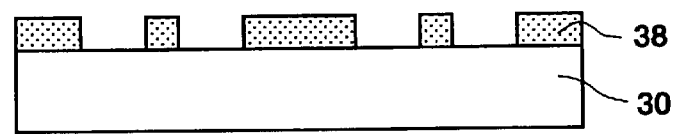
Figure 5D:
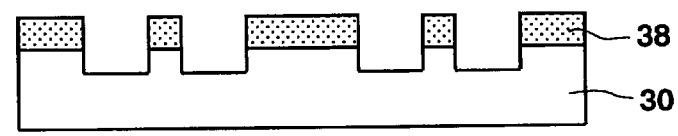
Figure 5E:

Further, in the case of the third and fourth producing method exhibited in FIGS. 4(a) to 4(f) and 5(a) to 5(g) respectively, photo resist 38 is coated on a stamp substrate 30 composed of a silicon substrate as shown in FIGS. 4(a) and 5(a) respectively. The photo resist 38 is exposed through a photo mask 34 that is patternized as shown in FIGS. 4(b) and 5(b), and resulted in being formed with a pattern after development as shown in FIGS. 4(c) and 5(c). By using gas such as $SF_6$, as shown in FIGS. 4(d) and 5(d), a patternized shape is formed on the stamp substrate 30 by the reactive ion etching method. As shown in FIGS. 4(e) and 5(e), the stamp substrate 30 that is patternized is obtained by removing the photo resist 38.

Furthermore, in the case of the third producing method shown in FIGS. 4(a) to 4(f), a dye film 44 is formed all over the patternized stamp substrate 30 and a third convex dye stamp 42A in which dye is patternized in a protruding shape is obtained as shown in FIG. 4(f).

Figure 5F:
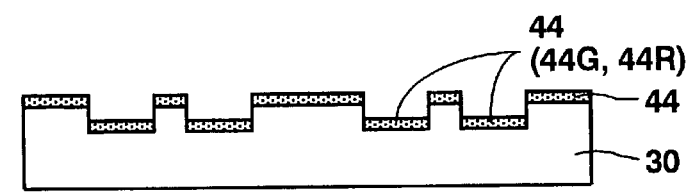
Figure 5G:
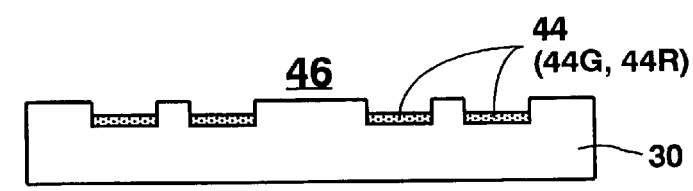

On the other hand, in the case of the fourth producing method shown in FIGS. 5(a) to 5(g), a release film (not shown) and a dye film 44 is formed in order all over the stamp substrate 30 by the vacuum evaporation method as shown in FIG. 5(f). Then, as shown in FIG. 5(g), by using adhesive tape or like, an excessive dye film 44 that is formed on the top surface of the stamp substrate 30 is removed and the dye film 44 that is patternized in a recessed shape is obtained. Consequently, a concave dye stamp 46 can be obtained. In this case, each concave dye stamp is produced for each color.

Further, with assuming that the concave dye stamp 46 is exclusively for B-color, for example, a concave dye stamp 46 for G-color can be produced by forming pattern that is equivalent to two pixels together with a dye film 44R for R-color.

With respect to height and depth of a protruding pattern and a recessed pattern of each dye stamp mentioned above, it is desirable to be within a range of 0.5 $\mu$m to 20 $\mu$m in consideration of easiness of producing a stamp substrate itself and amount of transferring dye. In a case that etching depth is too shallow, a recessed pattern is easy to be removed when an unnecessary portion is removed. In a case of a protruding shape, dye that is filmed on an area other than a protruding pattern is easy to be transferred.

Furthermore, in a case that the etching depth is too deep, a stamp substrate is hard to be produced due to an aspect ratio when etching.

Figure 6:
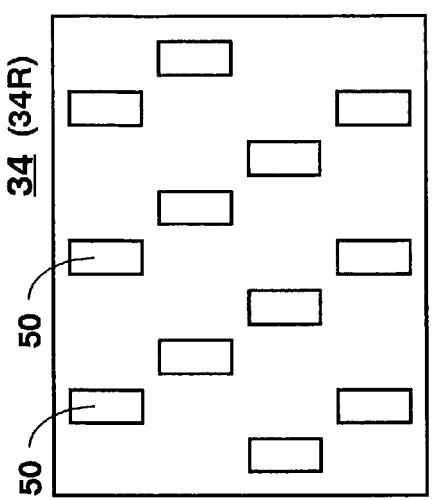
FIGS. 6(a1) to 6(c2) are plan views of photo masks used for producing the dye stamps according to the present invention.
Figure 6:
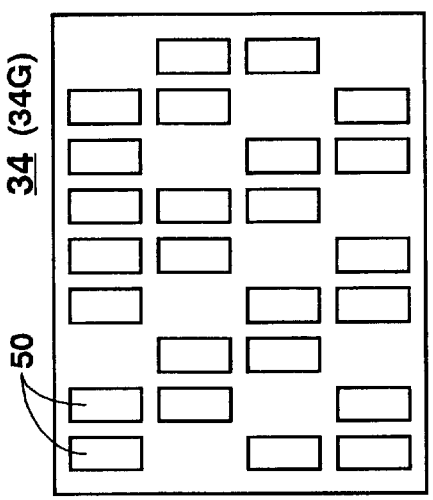
Figure 6:
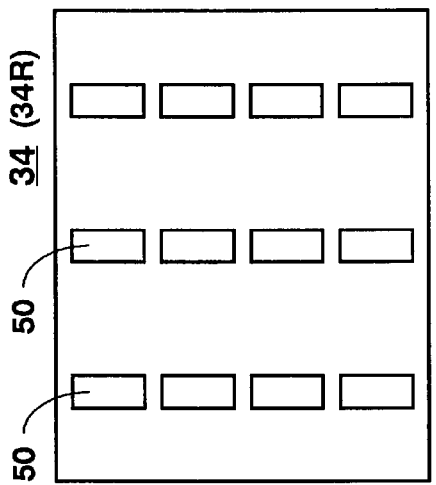
Figure 6:
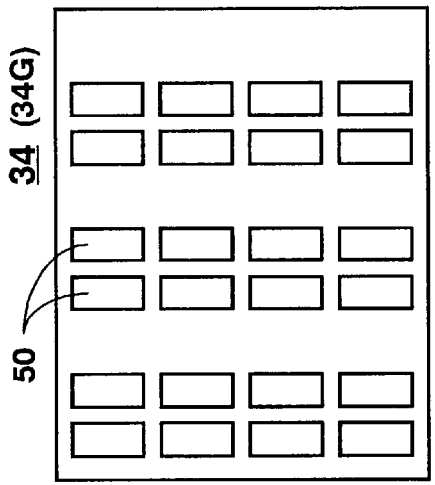
Figure 6:
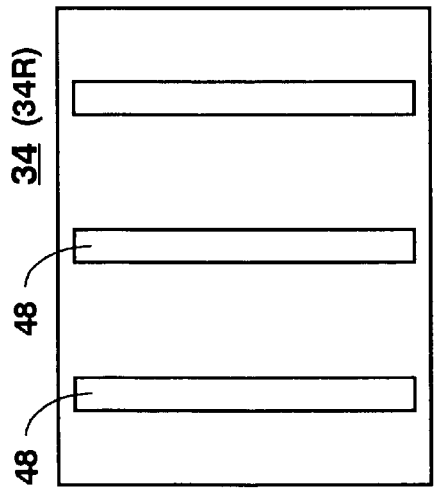
Figure 6:
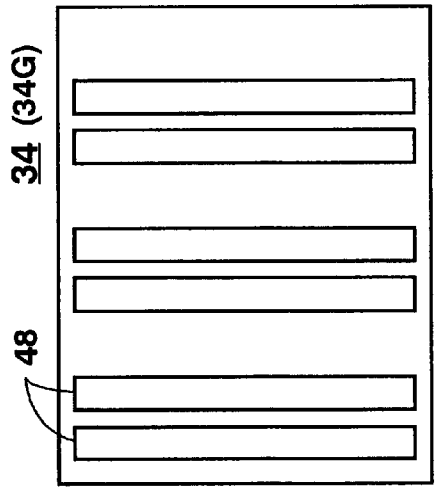

Various photo masks 34 shown in FIGS. 6(a1) to 6(c2) can be used for producing each dye stamp mentioned above.

FIGS. 6(a1) to 6(c2) are plan views of photo masks used for producing the dye stamps according to the present invention. In FIGS. 6(a1) to 6(c2), each drawing shows a photo mask 34R for R (red) color (hereinafter referred to as R photo mask 34R) or a photo mask 34G for G (green) color (hereinafter referred to as G photo mask 34G) respectively. With respect to a shape of opening on each photo mask 34, there provided a long rectangular hole 48 in a stripe shape as shown in FIGS. 6(a1) and 6(a2), a short rectangular hole 50 that is disposed linearly as shown in FIGS. 6(b1) and 6(b2), and the short rectangular hole 50 that is disposed in a staircase pattern shown in FIGS. 6(c1) and 6(c2). In these cases, each width of the long rectangular hole 48 and the short rectangular hole 50 is set to be narrower than width of a pixel area in consideration of doping dye when combining a dye stamp produced by the photo mask 34 with a series of recessed patterns that is surrounded by the separator 16 of an organic electroluminescence element (refer to FIG. 1). Preparing photo masks for each color of which opening (long rectangular hole or short rectangular hole) is disposed in different position by one pitch from each other can produce dye stamps for manufacturing an organic electroluminescence element.

Further, forming one long rectangular hole 48 or short rectangular hole 50 per one pixel in the R photo mask 34R corresponds to an R emissive layer. Furthermore, forming two long rectangular holes 48 or short rectangular holes 50 per one pixel in the G photo mask 34G corresponds to a G emissive layer and a R emissive layer respectively.

Any kinds of materials that have fluorescent or phosphorescent and emit respective color light of R, G and B can be used for each of the above-mentioned emissive materials (or dye). With respect to emissive materials for R-color, there provided porphyrin compound, chlorine compound, perylene compound, dicyanopyran compound, squarylium compound, distyril compound, juloridin compound, coumarin compound and compound of heavy metal complex such as iridium. With respect to emissive materials for G-color, there provided coumarin compound, quinacridone compound, compound of quinolinol metal complex and compound of heavy metal complex such as iridium. With respect to emissive materials for B-color, conventional fluorescent dye such as distyrylaryl compound, diarylamine compound, triarylamine compound, tetraphenylbutadiene, perylene and compound of heavy metal complex such as iridium can be used for the emissive materials for B-color.

By using energy transfer from an emissive material in a shorter wavelength side to another emissive material in a longer wavelength side, a method of increasing emission efficiency can be utilized. In this case, the more overlapping of an emission spectrum of the emissive material in the shorter wavelength side with that of the other emissive material in the longer wavelength side increases, the more efficiency of the energy transfer improves.

In a case that an emissive host material is the blue-color light range and emissive dopant is red-color, overlapping of emission spectrum of the host material and absorption spectrum of the dopant is small.

Further, an energy gap is too large to deteriorate energy transfer efficiency. In this case, by using a material having emission and absorption spectra in a wavelength region from green to orange so as to mediate the energy transfer, energy transfer efficiency from blue to red can be improved. The material for mediating the energy is called as assist dopant and the method is referred to as an energy assist method. In a case that assist dopant is an emissive material for green color, it is possible for each color of R, G and B to have functions of emitting light and transferring energy.

Furthermore, if a material that does not participate in light emission finally is reduced, emission efficiency is improved. Consequently, an emissive material for blue color is used for a pixel of blue color and the emissive material for blue color is added to a pixel of green color in addition to an emissive material for green color. As a result, energy transfer from blue to green is improved more.

Moreover, by making a pixel of red color contain emissive materials of green and blue colors and making an emissive material for green color have a function of assist dopant, energy in a shorter wavelength side is transferred to an emissive material for red color efficiently, and resulting in improving efficiency of an emissive material for red color.

In a case that a polymer material, which is a host material that diffuses those emissive materials mentioned above, emits blue (B) color light and a peak wavelength of the emitted light is in the B-color light wavelength range of less than 500 nm, for example, and further, in a case that the polymer material is previously diffused with an emissive material for B-color, a number of emissive materials to be diffused is just two: one for R-color and the other for G-color, and a host material is desirable to be a polymer material. An order of diffusion is that starting with B-color followed by G-color and finally R-color. The diffusing order is determined so as to transfer energy from a short wavelength emissive material to a predetermined emissive material efficiently.

Diffusing an emissive material for B-color into a host material for B-color is for increasing efficiency and chromaticity. A light emitting section of G-color diffuses at least an emissive material for G-color to a host material for B-color and makes energy transfer to the emissive material for G-color easier so as to obtain efficient light emission of G-color. A light emitting section of R-color contains at least a host material for B-color and an emissive material for G-color and is effective for making energy transfer from the host material for B-color to an emissive material for R-color easier. If there is existed no emissive material for G-color, energy of B-color would not be transferred to the emissive material for R-color completely and light of B-color is kept emitting at the same time. In an extreme case, the light emission becomes white color system by the light emission of B-color and R-color.

Further, controlling concentration of emissive material for R-color is more important than that for other colors and is essential to be adjusted for optimum light emission efficiency.

Accordingly, it is desirable for the emissive material for R-color to be diffused after the emissive material for G-color has been diffused fully.

With referring to FIGS. 7(*a*) to 7(*h*), a manufacturing method of an organic electroluminescence element according to the present invention is explained next.

FIGS. 7(*a*) to 7(*h*) show a manufacturing process of the organic electroluminescence element according to the present invention.

Foundation of an organic electroluminescence element is composed of a semiconductor substrate 14 such as a silicon substrate. A driving circuit (not shown) is formed on the surface of the semiconductor substrate 14. A first electrode 18 that is divided is formed on the surface of the driving circuit as a pixel electrode, and then a separator 16 is formed in accordance with necessity through the photolithography method. In some cases, the separator 16 is not provided.

As shown in FIG. 7(*a*), a photo resist layer 52 is coated on the surface of the silicon substrate 14 on which a plurality of first electrodes 18 that is separated by a plurality of separators 16 is formed, and dried. In FIG. 7(*b*), the photo resist 52 is exposed through a photo mask 54 for forming a plurality of separators. In FIG. 7(*c*), the exposed photo resist 52 is developed and resulted in forming the separator 16 having a shape that covers an edge portion of each of the plurality of first electrodes 18. In this case, an emissive layer 22 to be diffused with dye is essential to be separated in accordance with a pixel, so that height of the separator 16 is as high as a range of 200 nm to 1000 nm in consideration of total film thickness of light emitting element that is formed thereafter. Consequently, an edge portion of each pixel can be prevented from short-circuiting. The separator 16 can perform a role of black matrix by using resist that is diffused with black dye.

In FIG. 7(*d*), a B emissive layer 22B (generically referred to as emissive layer 22) is formed on each of the plurality of first electrodes 18 by diffusing an emissive material for B-color. As shown in FIG. 7(*e*), the semiconductor substrate 14 that is formed with the B emissive layer 22B is jointed together with the first convex dye stamp 36 shown in FIG. 2(*c*) with facing each other In FIG. 7(*e*), the second convex dye stamp 42 shown in FIG. 3(*f*) or the third convex dye stamp 42A shown in FIG. 4(*f*) can be used instead of the first convex dye stamp 36.

Figure 7A:
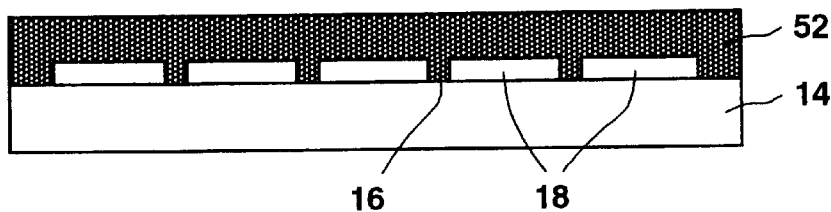
FIGS. 7(a) to 7(h) show a series of manufacturing process of the organic electroluminescence element according to the present invention.
Figure 7B:
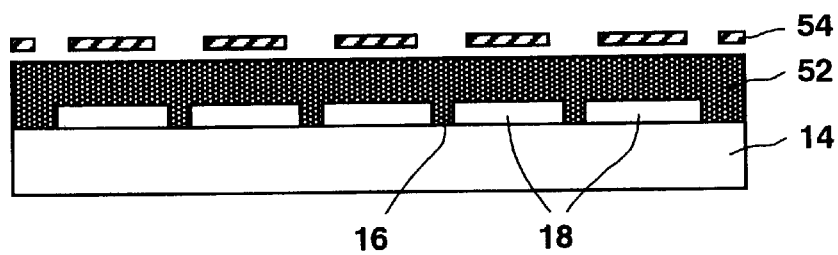
Figure 7C:
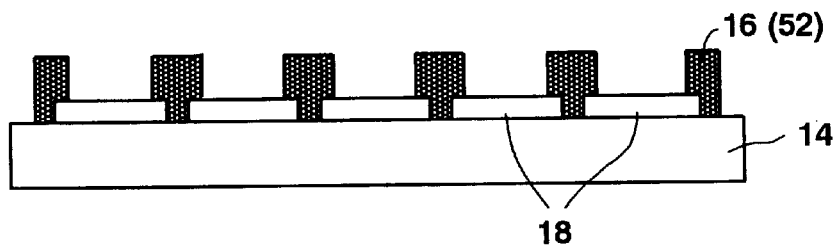
Figure 7D:
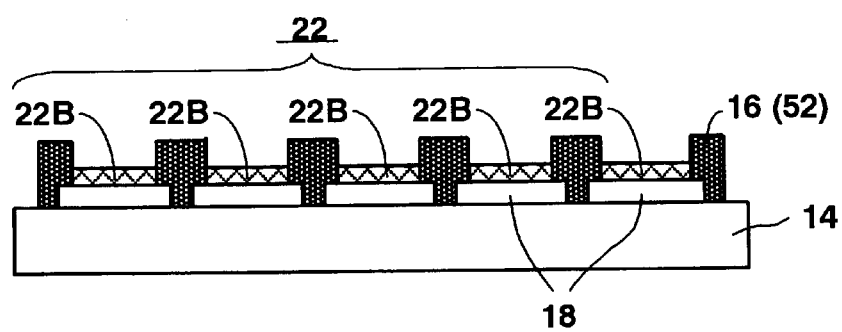
Figure 7E:
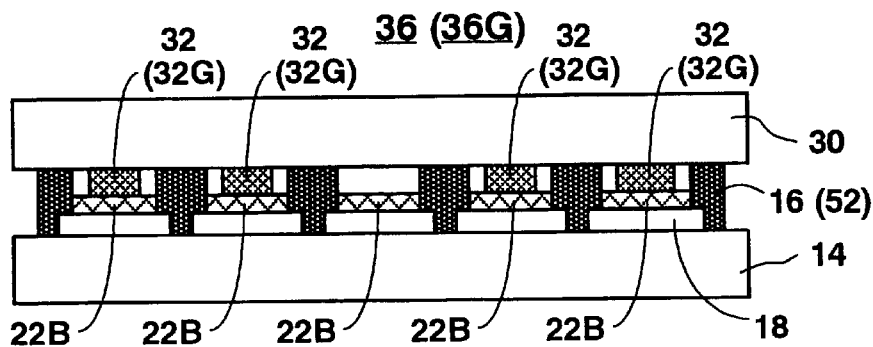

Further, a thin film 32 of the first convex dye stamp 36 shown in FIG. 7(e) contains an emissive material for G-color that is diffused secondary. Therefore, hereinafter the first convex dye stamp 36 is referred to as a first convex dye stamp 36G and the thin film 32 is referred to as a thin film 32G for G-color.

Figure 7F:
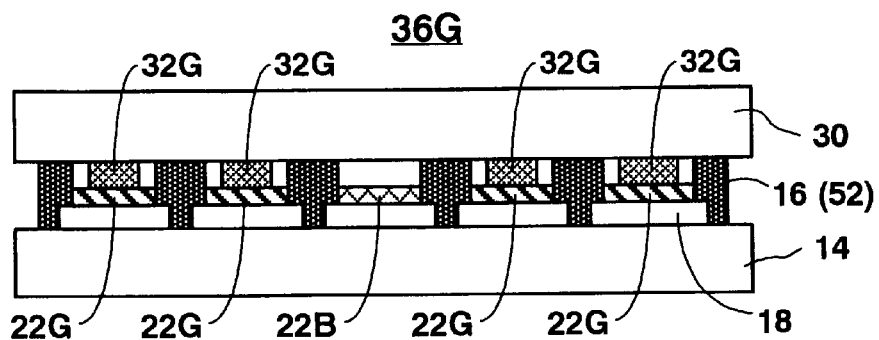

In FIG. 7(f), by heating the first convex dye stamp 36G, the emissive material for G-color contained in the thin film 32G is heated and diffused into a selected emissive layer out of the plurality of emissive layers 22B for B-color, and resulted in doping the emissive material for G-color into the selected emissive layer. In this process, a emissive layer that is not doped with the emissive material for G-color is kept remaining as the emissive layer 22B for B-color and a emissive layer that is doped with the emissive material for G-color becomes the emissive layer 22G.

Furthermore, it is desirable to be formed with a not-shown hole injection layer and a hole transport layer 20 (refer to FIG. 1) before forming the emissive layer 22 (22B). The hole injection layer, which is constituted by compound such as mixture of polythiophene compound and polystyrene sulfonate compound, polyaniline compound or phthalocyanine compound, and a hole transport layer, which contains a plurality of triarylamine groups in a molecule, is formed if necessary.

Either one of a small molecular material that is produced by a vapor deposition method and a polymer material that is produced by a wet process can be used for the emissive layer 22B for B-color. However, a polymer material is desirable for the emissive layer 22B so as to dope dye. In a case that the polymer material itself is an emissive material for B-color or the polymer material previously contains a small molecular emissive material for B-color through a process such as dispersion, the emissive layer 22B for B-color can be produced by the wet process.

With respect to an emissive layer of polymer material, polymer such as polyfluorene compound, polyphenylene vinylene compound, polythiophene compound, poly(N-vinylcarbazole) compound, poly(N-phenylcarbazole) compound, poly(vinyl-N-phenylcarbazole) compound, polycarbonate compound and polyacetylene compound or copolymer of the above-mentioned polymer and a molecular group having functions of electron injecting, electron transporting and chromaticity improving can be used. In order to transfer energy to dye to be doped, it is desirable for shortest peak wavelength of emitted light to be less than 500 nm, more desirably to be 450 nm. With respect to a filming process, it is realized by a regular wet process such as spin coating method, casting method, dipping method, spraying method and Langmuir Blodgett technique. It is acceptable for film thickness to be within a range of 10 nm to 200 nm, desirably within a range of 50 nm to 100 nm. In addition to using a polymer material alone, it is also used that a hole transporting material such as carbazole compound is mixed with an electron transporting material such as oxadiazole compound and triazole compound, and then the mixture is coated.

By heating the first convex dye stamp 36, dye is doped from the dye stamp to the emissive layer after confronting the first electrode 18 on the silicon substrate 14 with the R-G-B pattern on the first convex dye stamp 36 accurately. In this process, heating can be applied to the dye stamp side in inert atmosphere, both of the dye stamp side and the silicon substrate side, or either one side of the dye stamp and the silicon substrate.

Further, it is possible to leave whole of the dye stamp and the silicon substrate that face each other in elevated temperature atmosphere. In order to make outline of dye pattern clear when transferring dye, it is desirable for the dye stamp and the silicon substrate to be pressurized uniformly.

Diffusion of dye depends on factors such as concentration of the dye that is doped, heating temperature, heating time duration, melting point of the dye, boiling point of the dye and temperature of glass transition point (Tg) of a host polymer material. Controlling diffusion temperature and diffusion time duration results in diffusing dye into a polymer film uniformly. Dye concentration is rather high on the surface and its neighboring area in the emissive layer side when the diffusion process is just completed. However, the dye gradually and uniformly diffuses into the emissive layer as the time proceeds. Breeding in an adjacent pixel of different color can be prevented by the separator 16. Therefore, the corresponding pixel is diffused so as to be optimum concentration. It is hard to analyze quantitatively concentration of doped dye directly. However, another quantitative analysis can be realized by measuring electroluminescent intensity or photoluminescence intensity of emissive layer as relative comparison. Concentration of doped dye maintains an optimum value under optimum conditions of EL. On the contrary, in the case that the concentration is less than the optimum concentration, emission strength is low. Further, in a case that dye is excessively doped, emission strength lowers due to optical quenching caused by excessive concentration of doped dye.

By confronting the dye stamp and the silicon substrate for electroluminescence element with each other and by heating and diffusing dye, an accurate amount of arbitrary dye can be doped in a predetermined minute portion of polymer emissive layer. Therefore, a color element in high definition can be realized easily. Further, when confronting an emissive layer with a thin film that contains dye each other, it is acceptable that the emissive layer is contacted with the thin film directly. However, a thin film of dye that remains on the surface of the emissive layer without being doped in the emissive layer can be rinsed out by solvent that can solve dye but can not solve a raw material of the emissive layer. Furthermore, if the emissive layer having the thin film is post-baked after the dye stamp is removed, the dye can be doped in the emissive layer. In a case of doping each color independently, the process shall be repeated until all colors of B, G and R are doped.

Referring back to FIGS. 7(a) to 7(h), as mentioned above, in the case that the emissive layer 22B for B-color is formed as shown in FIG. 7(d), the first convex dye stamp 36G having the emissive material for G-color is confronted with the emissive layer 22B as shown in FIG. 7(e), and then they are heated so as to diffuse. Consequently, as shown in FIG. 7(f), an emissive layer 22G for G-color is formed.

Figure 7G:
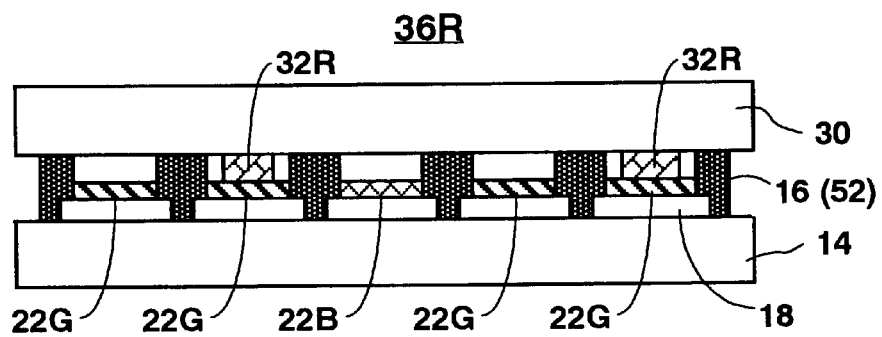
Figure 7H:
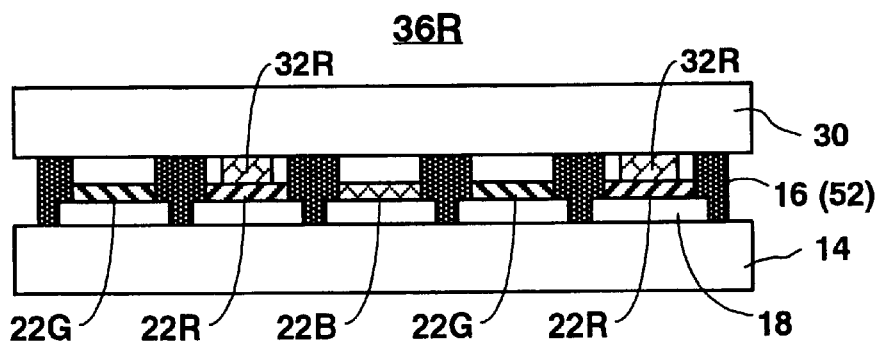

As shown in FIG. 7(g), a first convex dye stamp 36R having a thin film 32R for R-color that contains emissive material for R-color is contacted with the silicon substrate 14 for an organic electroluminescence element. By heating them as the same manner as mentioned above, the emissive material for R-color selectively dopes in an emissive layer 22G that corresponds to the respective thin film 32R and dopes as shown in FIG. 7(h). Consequently, the emissive layer 22G for G-color that is not doped with the emissive material for R-color remains as the emissive layer 22G and the emissive layer 22G for G-color that is doped with the emissive material for R-color is converted into an emissive layer 22R for R-color.

As mentioned above, it is desirable for each dye as for an emissive material that a sequential order of transferring each dye is B, G and R in order. The emissive layer 22B for B-color can be formed by a polymer material through the coating process. With respect to dye for G-color, two kinds of dye for two pixels, one for G-color and the other for R-color, are produced and transferred at the same time. In a case that an optimum concentration when emitting the G-color light is far different from concentration that optimizes energy transition when emitting the R-color light, the dye for G-color, for example, can be transferred twice with respect to each pixel.

In a case of using the concave dye stamp 46 shown in FIG. 5(g), a manufacturing process of an organic electroluminescence element is shown in FIGS. 8(a) to 8(e). The manufacturing process is identical to the process that uses the first convex dye stamp 36 mentioned above except for a shape of dye stamp.

Figure 8A:
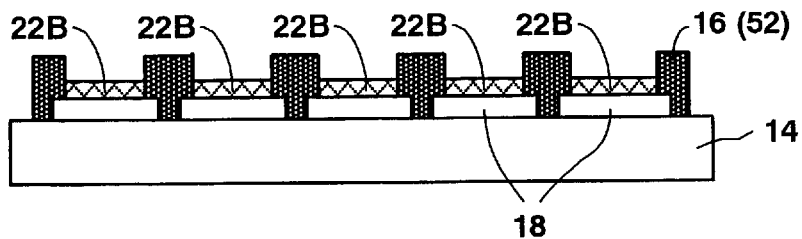
FIGS. 8(a) to 8(e) show another series of manufacturing process of the organic electroluminescence element according to the present invention.

FIGS. 8(a) to 8(e) show another manufacturing process of the organic electroluminescence element according to the present invention. As shown in FIG. 8(a), an emissive layer 22B for B-color is formed all over a silicon substrate 14 that is formed with a plurality of first electrodes 18 and a plurality of separators 16.

Figure 8B:
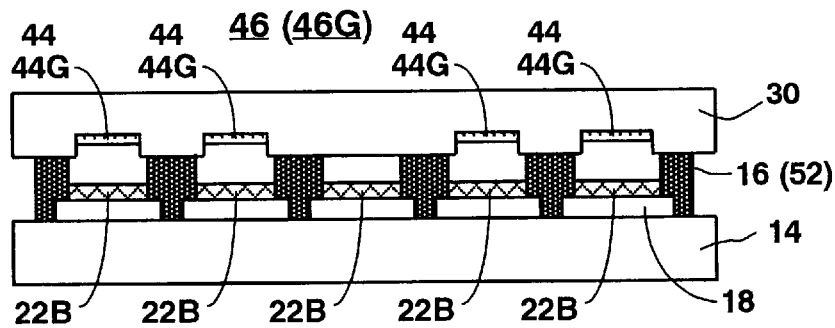

In FIG. 8(b), the concave dye stamp 46 is contacted with the silicon substrate 14 with facing each other. In this case, a dye film 44G that contains an emissive material for G-color is used for the concave dye stamp 46G as a dye film.

Figure 8C:
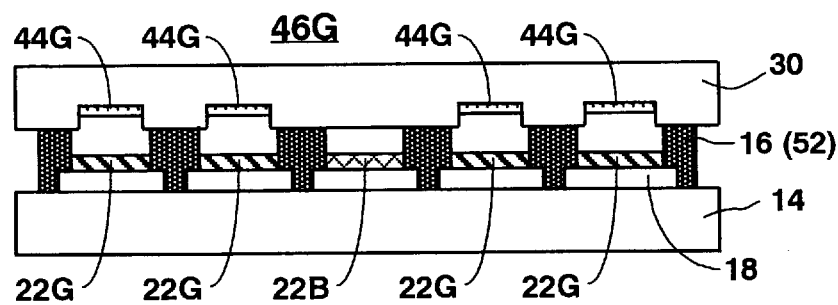

By heating them, the emissive material for G-color that is contained in the dye film 44G is heated and diffused, and resulted in doping the emissive material for G-color selectively in some of the plurality of emissive layer 22B for B-color. Consequently, as shown in FIG. 8(c), an emissive layer 22G for G-color is formed.

Figure 8D:
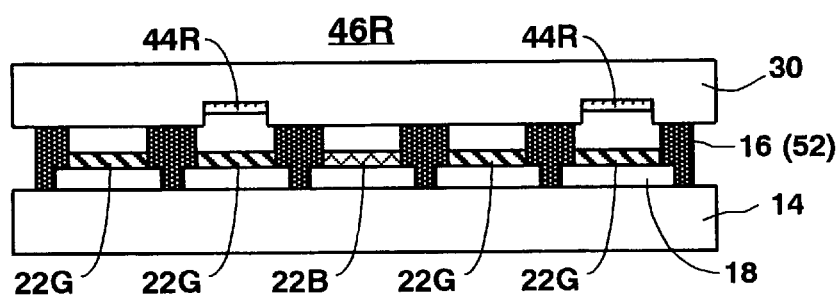

In FIG. 8(d), a concave dye stamp 46R having a dye film 44R that contains a emissive material for R-color is contacted with the silicon substrate 14 for the organic electroluminescence element with facing each other.

Figure 8E:
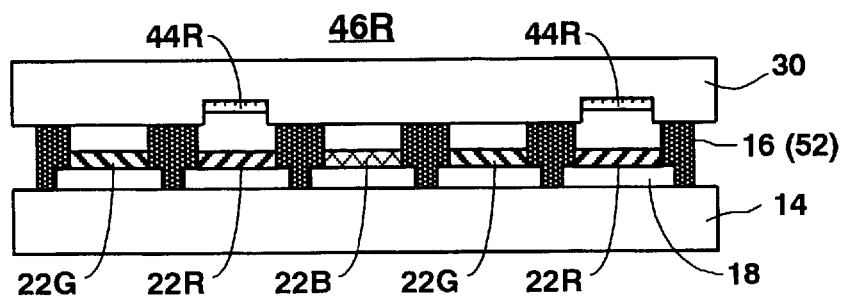

Then, by heating them, the emissive material for R-color that is contained in the dye film 44R is heated and diffused, and resulted in doping the emissive material for R-color selectively in some of the plurality of emissive layer 22G for G-color. Consequently, as shown in FIG. 8(e), an emissive layer 22R for R-color is formed. Accordingly, doping all the emissive materials is completed.

On the emissive layers 22B, 22G and 22R, which are completed in doping, a hole blocking layer that is constituted by a material such as aluminum quinolinato complex such as BAlq2, bathocuproine compound and triazole compound, an electron transport layer that is constituted by a material such as quinolinol metal complex and oxazole compound, and an electron injection layer that is constituted by a material such as fluoride and/or oxide of alkali metal and/or alkaline earth metal is formed. Then, a second electrode 26 and a transparent electrode 28 (refer to FIG. 1), which is an extra thin film cathode and composed of an alkali metal, an alkaline earth metal or their alloy that is low in work function such as Al, Mg, Li, Ca and Cs, is formed. Consequently, an organic electroluminescence element is completed.

Further, in this embodiment, a silicon substrate that is installed with a single crystal transistor is used for a substrate. However, a glass substrate that is installed with a polysilicon TFT (Thin Film Transistor) can substitute the silicon substrate. Hereinafter the glass substrate installed with a polysilicon TFT is referred to as "polysilicon TFT substrate". Using the polysilicon TFT substrate is advantageous to a manufacturing cost, because a manufacturing facility for LCD is ready for such a polysilicon TFT substrate as well as applying the current LCD technology for manufacturing a polysilicon TFT substrate. However, conducting emitted light out through a glass substrate side decreases an aperture ratio, and resulted in being optically disadvantageous. Consequently, emitted light can be conducted out from the top surface of the substrate so as to increase efficiency.

Furthermore, in a case that a silicon substrate is used as a semiconductor substrate, there existed advantages such that a single crystal silicon transistor having larger carrier mobility can be used, minute processing is easy for the silicon substrate, and an electrode can be formed in a shape that obtains a high aperture ratio. Consequently, an organic electroluminescence element that is constituted by a silicon substrate can be applied for a high definition display element.

Moreover, an active matrix layer having a pixel-controlling transistor is previously installed on the silicon substrate in a preceding process. In the active matrix layer, the transistor is composed of source, gate, drain, capacitor and wiring. The circuit is constituted by a transistor and a capacitor. One and two transistors or more transistors constitute the circuit. Constituting a plurality of transistors for switching and driving is suitable for an organic electroluminescence element.

A method of conducting emitted light externally from a top surface of semiconductor substrate according to the present invention can be realized by following two methods.

One method is such that an electrode of ITO (indium-tin oxide) or like is formed on a pixel electrode 18 of Al or like, which is formed on a silicon substrate having an active matrix circuit, and a second electrode 26 that is a transparent ultra thin film cathode is formed after a hole injection layer, a hole transport layer 20, an emissive layer 22, an electron transport layer 24 and an electron injection layer is formed in order, and then a transparent electrode 28 of ITO or like is formed on the second electrode 26. Consequently, emitted light is conducted to the direction of top surface of the electroluminescence element, that is, the emitted light is conducted from the cathode side of the electroluminescence element.

The other method is such that an Al electrode of cathode is formed on a silicon substrate having an active matrix circuit first, and then forming each of the layers mentioned above in the reverse order manufactures an electroluminescence element. However, in a case that some layers such as electron transport layer and electron injection layer are formed in the lower layer, it should pay attention to selecting solvent for forming an emissive layer so as to prevent damages to the lower layer from the solvent.

Further, from the point of view of improving aperture ratio of pixel in an active matrix element, the method of conducting emitted light from a top surface of electroluminescence element is superior to the other method and an electroluminescence element having aperture ratio of more than 90% can be manufactured.

Furthermore, a protective film is formed above the transparent electrode 28 so as to prevent moisture and oxygen from penetrating into the electroluminescence element, and resulted in extending life of the electroluminescence element. A transparent inorganic protective film such as $Si_{1-X}O_X$, $Si_{1-Y}N_Y$ and $Si_{1-Z}NO_Z$ or a laminated film that is laminated with organic UV curable resin is suitable for a material for forming a protective film.

According to the present invention, an organic electroluminescence element in multicolor and high definition, which is manufactured by doping dye by heat, can be realized. However, as an application of doping by inducing heat, doping a small molecular material having a certain mobility of electron or hole in a polymer material such as emissive layer, hole injection layer and electron injection layer can increase efficiency of carrier transportation and emission efficiency.

An organic electroluminescence element according to the present invention is actually manufactured and evaluated, so that a result of evaluation is explained next.

A substrate for electroluminescence element is manufactured as follows:

A non-alkali glass substrate, which is formed with indium-tin oxide film having sheet resistance of 5 $\Omega/cm^2$, in 1.1 mm thick and 50 mm square is cleaned by detergent, deionized water, acetone and IPA (isopropyl alcohol) for 10 minutes respectively through the ultrasonic cleaning method and followed by a surface treatment for 2 minutes in the oxygen plasma atmosphere. Then, a layer of polyethylene dioxythiophene/polystyrene sulfonate (PEDT/PSS) (such as Baytron P4083 manufactured by Bayer) is formed from water dispersed solution in 60 nm thick through the spin coat method as a hole injection layer. Dispersing 2-(4-biphenylyl)-5-(4-tert-butyl phenyl)-1,3,4-oxadiazole (PBD) as an electron transporting material and 1,1,4,4-tetra phenyl-1,3-butadiene (TPB) as an emissive material for B-color into poly(N-vinyl carbazole) (PVK) is used for a polymer emissive layer. The substrate for electroluminescence element mentioned above is common to each embodiment and each comparative example that will be explained later.

With respect to a dye stamp, dispersing objective emissive dye is processed by a dye stamp method. A dye stamp that is used in this embodiment is produced by the aforementioned method with referring to FIGS. 5(a) to 5(g). The method is that dye to be diffused is patterned by using a silicon substrate, which is previously cut in a predetermined size that corresponds to a pixel in a recessed or protruding shape.

In the embodiments and comparative examples, a silicon substrate that is processed in a recessed shape is used. A producing method of the silicon substrate is identical to the method shown in FIGS. 5(a) to 5(g) except for a mask shape.

Positive type resist is coated on a 3-inch silicon substrate in approximately 2 $\mu$m thick by the spin-coating method (refer to FIG. 5(a)). The resist is exposed by a g-line exposure apparatus through a mask having an opening of 20 mm square (refer to FIG. 5(b)). By a development process, 20 mm square resist is opened (refer to FIG. 5(c)). The developed silicon substrate is made to react with $SF_6$ gas for 40 minutes under electric discharge power of 50 W by the reactive ion etching (RIE) method and a recessed pattern in 7.5 $\mu$m deep is formed on the silicon substrate (refer to FIG. 5(d)). Then, the resist on the surface of the silicon substrate is removed and a stamp substrate is obtained (refer to FIG. 5(e)).

The stamp substrate is loaded into a vacuum evaporator and formed with a film of Au in 100 nm thick as a not shown release layer, and then emissive dye for doping is formed in 40 nm thick (refer to FIG. 5(f)).

Using a release tape such as an adhesive tape removes an extra dye layer and the gold release layer on the surface of the stamp substrate after the stamp substrate is taken out from the vacuum evaporator (refer to FIG. 5(G)).

Consequently, the stamp substrate, which is patterned on a pixel size to be diffused with a dye layer previously, is obtained. With respect to diffusion of emissive dye, as mentioned above, a polymer emissive material on the substrate for electroluminescence element is kept confronting with the stamp substrate with dye, and then the dye is transferred to the polymer emissive material by heating.

The substrate for electroluminescence element is loaded into the vacuum evaporator once again after the desired emissive dye is diffused. In the vacuum evaporator, a film of Ca in 30 nm thick and an Ag electrode having thickness of 300 nm is formed as a cathode. The substrate for electroluminescence element having the cathode is taken out from the vacuum evaporator and placed in the dry nitrogen atmosphere. The substrate is covered by a glass cap of which a section for margin to paste up is coated with UV curable resin and irradiated with UV irradiation for one minute so as to cure the resin and seal. Accordingly an organic electroluminescence element is manufactured.

Embodiment 1

In a process of thermally dispersing G-color dye into a pixel that emits the G-color light, composition of a polymer emissive material in an electroluminescence element is set to PVK:PBD:TPB=72:22:6, and the polymer emissive material is coated on a glass substrate, which has ITO and is formed with PEDT/PSS in 60 nm thick, as thick as 45 nm through the spin coat method. The glass substrate is confronted with a silicon substrate, which is formed with a film of coumarin-6 in 40 nm thick as emissive dye for G-color on an Au layer in 100 nm thick for release through the vacuum evaporation method, and then they are heated for 10 minutes at 140° C. in the nitrogen gas atmosphere by a heating furnace. Both the glass substrate and the silicon substrate are taken out from the heating furnace and they are apart from each other. The glass substrate having the polymer emissive layer is transferred to the vacuum evaporator and formed with Ca in 30 nm thick and an Ag electrode in 300 nm thick as a cathode. Consequently, an organic electroluminescence element is obtained.

Figure 9:
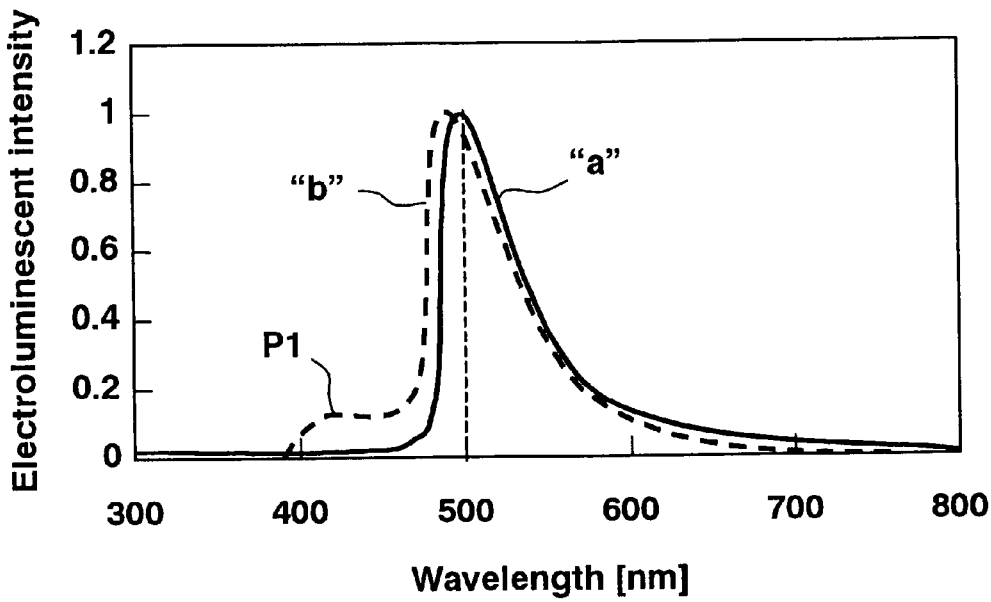
FIG. 9 is a graph showing electroluminescent intensity within a range of green-color light according to the embodiment of the present invention and a comparative example.

FIG. 9 is a graph showing electroluminescent intensity within a range of green-color light according to the embodiment of the present invention and a comparative example.

When electric current is supplied across the electrodes of the organic electroluminescence element that is manufactured as mentioned above, a curved line "a" of G-color light emission shown in FIG. 9 is obtained. The curved line "a" is characterized in that a peak wavelength at 100 cd/m$^2$ of light emission is 500 nm, luminous efficiency is 1.1 cd/A and the CIE (Commission Internationale de l'Eciairage) chromaticity is (0.26, 0.55). According to the embodiment 1 that shows the curved solid line "a", the organic electroluminescence element of the embodiment 1 is excellent in an emission characteristic.

Comparative Example 1

An organic electroluminescence element of comparative example 1 is identical to that of the embodiment 1 except for composition of a polymer emissive material. The composition of polymer emissive material according to the comparative example 1 is set to PVK:PBD=77:23. A curved broken line "b" shown in FIG. 9 is obtained when making the organic electroluminescence element according to the comparative example 1 emit light. The curved line "b" is characterized in that a sub-peak P1 appears at a lower wavelength region of the spectrum, a peak wavelength at 100 cd/m$^2$ of light emission is 496 nm, current efficiency is 0.8 cd/A and the CIE chromaticity is (0.26, 0.52). The wavelength of the comparative example 1 is similar to that of the example 1. However, the current efficiency is inferior to that of the embodiment 1 slightly.

According to the comparative example 1 that shows the curved line "b", the organic electroluminescence element of the comparative example 1 is deteriorated in an emission characteristic slightly.

Embodiment 2

In a process of thermally dispersing G-color dye into a pixel that emits the R-color light, composition of a polymer emissive material in an electroluminescence element is set to PVK:PBD:TPB=72:22:6, and the polymer emissive material is coated on a glass substrate, which has ITO and is formed with the PEDT/PSS layer in 60 nm thick, as thick as 45 nm through the spin coat method. The glass substrate is confronted with a silicon substrate, which is formed with a film of coumarin-6 in 40 nm thick as emissive dye for G-color on an Au layer in 100 nm thick for release through the vacuum evaporation method, and then they are heated for 10 minutes at 140° C. in the nitrogen gas atmosphere by a heating furnace. Both the glass substrate and the silicon substrate are taken out from the heating furnace and they are apart from each other.

Further, the glass substrate is confronted with another silicon substrate, which is formed with a 40 nm thick film of emissive dye for R-color, that is, 4-(dicyanomethylene)-2-methyl-6-(julolidin-4-yl-vinyl)4H-pyran (DCJT) on an Au layer in 100 nm thick for release through the vacuum evaporation method, and then they are heated for 10 minutes at 175° C. in the nitrogen gas atmosphere by a heating furnace. Both the glass substrate and the silicon substrate are taken out from the heating furnace and they are apart from each other.

The glass substrate having the polymer emissive layer is transferred to the vacuum evaporator and formed with a film of Ca in 30 nm thick and an Ag electrode in 300 nm thick as a cathode. Consequently, an organic electroluminescence element is obtained.

Figure 10:
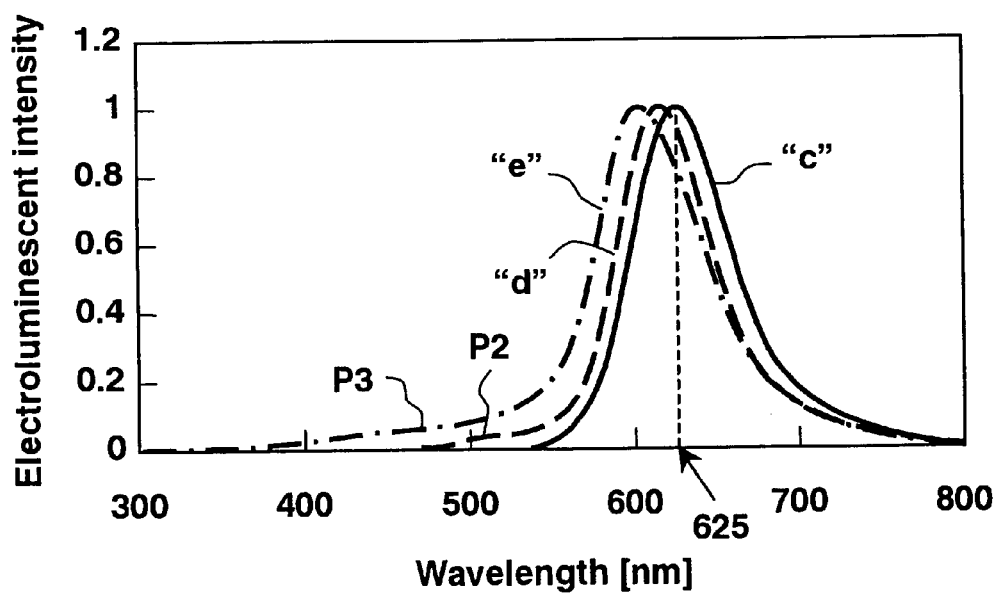
FIG. 10 is a graph showing electroluminescent intensity within a range of red-color light according to the embodiment of the present invention and comparative examples.
Figure 11:
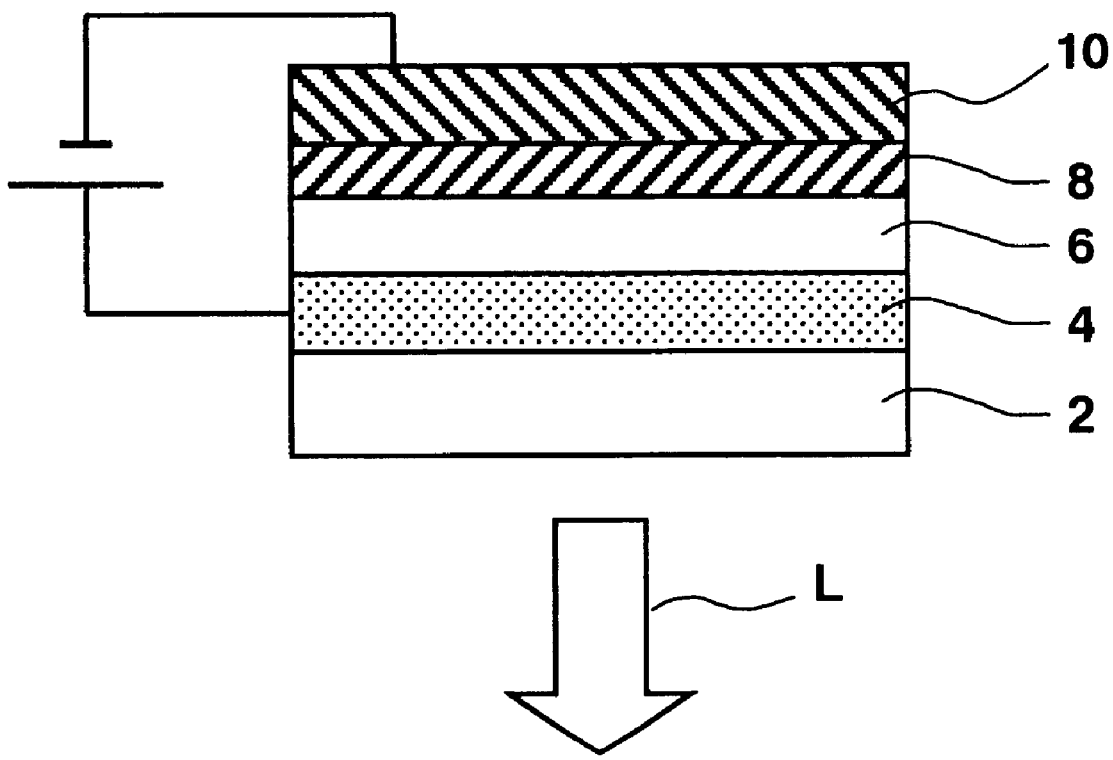
FIG. 11 is an enlarged cross sectional view of a conventional organic electroluminescence element according to the prior art.

FIG. 10 is a graph showing electroluminescent intensity within a range of red-color light according to the embodiment of the present invention and comparative examples.

When electric current is supplied across the electrodes of the organic electroluminescence element that is manufactured as mentioned above, a curved solid line "c" of R-color light emission shown in FIG. 10 is obtained. The curved line "c" is characterized in that a peak wavelength at 100 cd/m$^2$ of light emission is 625 nm, current efficiency is 0.8 cd/A and the CIE chromaticity is (0.63, 0.37). According to the embodiment 2 that shows the curved line "c" in FIG. 10, the organic electroluminescence element of the embodiment 2 is excellent in a emission characteristic.

Comparative Example 2

An organic electroluminescence element of comparative example 2 is identical to that of the embodiment 2 except for composition of a polymer emissive material. The composition of polymer emissive material according to the comparative example 2 is set to PVK:PBD=77:23. A curved broken line "d" shown in FIG. 10 is obtained when making the organic electroluminescence element according to the comparative example 2 emit light. The curved line "d" is characterized in that a bottom broadening P2 appears at a lower wavelength region of the spectrum, a peak wavelength at 100 cd/m$^2$ of light emission is 618 nm, current efficiency is 0.7 cd/A and the CIE chromaticity is (0.62, 0.38).

According to the comparative example 2 that shows the curved line "d" in FIG. 10, the organic electroluminescence element of the comparative example 2 is deteriorated in an emission characteristic slightly.

Comparative Example 3

An organic electroluminescence element of comparative example 3 is identical to that of the embodiment 2 except for composition of a polymer emissive material and emissive dye for G-color. According to the comparative example 3, the composition of polymer emissive material according to the comparative example 3 is set to PVK:PBD:TPB=72:22:6 and a film of emissive material for R-color, that is, DCJT is formed on the Au layer as emissive dye for G-color instead of coumarin-6.

A curved dot-dash line "e" shown in FIG. 10 is obtained when making the organic electroluminescence element according to the comparative example 3 emit light. The curved line "e" is characterized in that a relatively large bottom broadening P3 appears at a lower wavelength region of the spectrum, a peak wavelength at 100 cd/m$^2$ of light emission is 613 nm, current efficiency is 1.1 cd/A and the CIE chromaticity is (0.55, 0.41).

According to the comparative example 3 that shows the curved line "e" in FIG. 10, the organic electroluminescence element of the comparative example 3 is deteriorated in an emission characteristic considerably.

In addition thereto, the current efficiency of the comparative example 3 is higher than that of the embodiment 2. It is supposed to be caused by that the peak wavelength of emitted light of the comparative example 3 shifts to the shorter wavelength region than the peak wavelength of the embodiment 2.

Embodiment 3

A film of Ca in 30 nm thick and an Ag film in 300 nm thick is formed as a cathode on a emissive layer of which composition of a polymer emissive material is set to PVK:PBD:TPB=72:22:6 without diffusing any other color dye to the emissive layer. Consequently, an organic electroluminescence element according to the embodiment 3 is manufactured. By this organic electroluminescence element, a curved line of emitting B-color light (not shown) is obtained. The curved line is characterized in that a peak wavelength at 100 cd/m$^2$ of light emission is 430 nm, current efficiency is 1.3 cd/A and the CIE chromaticity is (0.17, 0.15). The organic electroluminescence element of the embodiment 3 is excellent in an emission characteristic.

According to the embodiments 1 through 3, as mentioned above, excellent RGB light-emission can be obtained and it is found that containing dye of emissive material for shorter wavelength results in excellent emission characteristics.

According to an aspect of the present invention, there provided an organic electroluminescence element in high definition and full-color. The organic electroluminescence element is manufactured by using a microscopic pattern, which is produced on a photosensitive resin that contains dye by the photolithography technique, and doping dye in a emissive layer on a substrate of the organic electroluminescence element by inducing heat, and then forming a plurality of pixels that corresponds to respective R, G and B colors and separated by a plurality of minute separators. Therefore, by controlling accuracy of positioning and temperature in a process of heating dye and doping, and by controlling accuracy of timing control can manufacture an organic electroluminescence element in high definition and full-color.

In addition thereto, by an element, which is driven by an active matrix method that uses a silicon substrate, following the method of conducting emitted light externally from a top surface of electroluminescence element, an organic electroluminescence element in high definition and high quality displaying can be obtained.

According to another aspect of the present invention, there provided an organic electroluminescence element, which can display in high definition and full-color, and further which is high in quality. Each pixel of the organic electroluminescence element contains dye not only colors of R, G and B but also B-color for a G-color pixel, and colors of G and B for an R-color pixel respectively.

It will be apparent to those skilled in the art that various modification and variations could be made in the organic electroluminescence element in the present invention without departing from the scope or spirit of the invention.

What is claimed is:

1. An organic electroluminescence element comprising:
   a plurality of first electrodes disposed on a substrate in matrix;
   a second electrode disposed with being confronted with each of the plurality of first electrodes; and
   a emissive layer formed between each of the plurality of first electrodes and the second electrode on each of the plurality of first electrodes, wherein the emissive layer is composed of a blue (B) emissive layer, a green (G) emissive layer and a red (R) emissive layer as a set of pixels,
   the organic electroluminescence element is further characterized in that
      the B emissive layer contains a B emissive material,
      the G emissive layer contains B and G emissive materials, and
      the R emissive layer contains B, G and R emissive materials.

* * * * *